United States Patent
Park et al.

(10) Patent No.: US 11,135,921 B2
(45) Date of Patent: Oct. 5, 2021

(54) BATTERY MANAGEMENT METHOD AND APPARATUS

(71) Applicant: Samsung Electronics Co., Ltd., Suwon-si (KR)

(72) Inventors: Jeonghyun Park, Seoul (KR); Sun-Jae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 905 days.

(21) Appl. No.: 15/488,549

(22) Filed: Apr. 17, 2017

(65) Prior Publication Data

US 2018/0093568 A1 Apr. 5, 2018

(30) Foreign Application Priority Data

Oct. 5, 2016 (KR) .................. 10-2016-0128222

(51) Int. Cl.
*B60L 3/00* (2019.01)
*G01R 31/3842* (2019.01)
(Continued)

(52) U.S. Cl.
CPC ........... *B60L 3/0046* (2013.01); *B60L 3/0015* (2013.01); *B60L 3/12* (2013.01); *G01R 31/3842* (2019.01);
(Continued)

(58) Field of Classification Search
CPC ......... B60L 2240/545; B60L 2240/547; B60L 2240/549; B60L 2240/62; B60L 2240/66; B60L 2240/662; B60L 2240/68; B60L 2240/70; B60L 2250/10; B60L 2250/16; B60L 3/0015; B60L 3/0046; B60L 3/12; B60L 58/24; B60L 58/10; B60L 58/14; B60L 58/25; B60L 3/36; G01R 31/3842; G01R 31/44; B60W 30/0956; B60W 30/0953; B60W 20/11; B60W 20/12; B60W 20/13; B60W 2050/143; B60W 2050/146

See application file for complete search history.

(56) References Cited

U.S. PATENT DOCUMENTS 4,275,344 A * 6/1981 Mori ...................... H02P 9/305
322/28
5,815,824 A * 9/1998 Saga ......................... B60K 6/46
701/22

(Continued)

FOREIGN PATENT DOCUMENTS

JP 2009-264779 A 11/2009
JP 2016-21865 A 2/2016
(Continued)

*Primary Examiner* — Hai Phan
*Assistant Examiner* — Son M Tang
(74) *Attorney, Agent, or Firm* — NSIP Law

(57) ABSTRACT

Disclosed is a battery management method including calculating a safety of a battery unit based on physical quantity data of the battery unit, monitoring for a threshold adjusting event to occur, performing a comparing with respect to the calculated safety and a threshold based on the monitoring indicating that the threshold adjusting event has occurred, the comparing being based on reference information corresponding to the threshold adjusting event, and selectively performing a feedback process to output a feedback dependent on a result of the comparison.

21 Claims, 10 Drawing Sheets

(51) Int. Cl.
*G01R 31/44* (2020.01)
*B60L 3/12* (2006.01)
*B60L 58/24* (2019.01)

(52) U.S. Cl.
CPC .............. *G01R 31/44* (2013.01); *B60L 58/24* (2019.02); *B60L 2240/545* (2013.01); *B60L 2240/547* (2013.01); *B60L 2240/549* (2013.01); *B60L 2240/62* (2013.01); *B60L 2240/66* (2013.01); *B60L 2240/662* (2013.01); *B60L 2240/68* (2013.01); *B60L 2240/70* (2013.01); *B60L 2250/10* (2013.01); *B60L 2250/16* (2013.01)

(56) References Cited

U.S. PATENT DOCUMENTS

| | | | | |
|---|---|---|---|---|
| 6,404,163 | B1* | 6/2002 | Kapsokavathis | H02J 7/008 320/104 |
| 6,424,157 | B1* | 7/2002 | Gollomp | G01R 31/006 324/430 |
| 6,702,052 | B1* | 3/2004 | Wakashiro | B60K 6/48 180/65.25 |
| 7,122,979 | B2* | 10/2006 | Wilton | B60L 3/0046 318/400.09 |
| 7,548,805 | B2* | 6/2009 | Yamaguchi | B60W 30/095 180/271 |
| 8,364,399 | B2* | 1/2013 | Wendling | B60G 17/0152 701/400 |
| 8,521,410 | B2* | 8/2013 | Mizuno | B60W 50/0097 701/123 |
| 8,618,775 | B2 | 12/2013 | Hermann et al. | |
| 8,670,888 | B1* | 3/2014 | Brenner | B60L 15/2045 701/22 |
| 8,838,318 | B2* | 9/2014 | Segawa | G01C 21/34 701/22 |
| 9,091,559 | B2* | 7/2015 | Hancock | B60L 3/12 |
| 9,145,142 | B2* | 9/2015 | Matsuno | B60W 30/182 |
| 9,203,255 | B2* | 12/2015 | Hong | H02J 7/00 |
| 9,248,746 | B2* | 2/2016 | Wen | B60L 3/04 |
| 9,517,705 | B1* | 12/2016 | Liu | B60K 1/02 |
| 10,254,348 | B2* | 4/2019 | Park | G01R 31/3648 |
| 10,994,617 | B2* | 5/2021 | Rahbari Asr | B60L 3/12 |
| 2005/0182536 | A1* | 8/2005 | Doyle | G01R 31/3647 701/31.4 |
| 2006/0276980 | A1* | 12/2006 | Mizuno | G01R 31/3828 702/63 |
| 2007/0093954 | A1* | 4/2007 | Malone | F02D 41/22 701/112 |
| 2007/0225882 | A1* | 9/2007 | Yamaguchi | B60W 30/095 701/36 |
| 2010/0094496 | A1* | 4/2010 | Hershkovitz | B60L 3/12 701/22 |
| 2011/0087627 | A1* | 4/2011 | Schmid | G06N 3/0454 706/21 |
| 2012/0032637 | A1* | 2/2012 | Kotooka | B60K 6/46 320/109 |
| 2012/0150393 | A1* | 6/2012 | Knight-Newbury | B60L 3/04 701/45 |
| 2012/0197468 | A1* | 8/2012 | Frederick | B60W 10/06 701/22 |
| 2012/0212871 | A1 | 8/2012 | Taniguchi | |
| 2013/0154358 | A1* | 6/2013 | Kai | B60R 16/033 307/9.1 |
| 2013/0226441 | A1* | 8/2013 | Horita | B60Q 9/00 701/118 |
| 2013/0229742 | A1* | 9/2013 | Auguet | B60L 58/24 361/114 |
| 2013/0317690 | A1 | 11/2013 | Fujita et al. | |
| 2015/0263541 | A1* | 9/2015 | Fukui | H02J 7/0027 320/134 |
| 2016/0138492 | A1* | 5/2016 | Levy | F02D 29/02 701/102 |
| 2016/0244044 | A1* | 8/2016 | Miller | B60W 10/06 |
| 2016/0375782 | A1* | 12/2016 | Liu | B60L 53/665 320/109 |
| 2017/0117725 | A1* | 4/2017 | Hendricks | H01M 10/486 |
| 2017/0203689 | A1* | 7/2017 | Kuwahara | B60Q 9/00 |
| 2017/0263060 | A1* | 9/2017 | Sukumaran | G07C 5/0808 |
| 2018/0361855 | A1* | 12/2018 | Stachewicz | H01M 50/20 |
| 2019/0176639 | A1* | 6/2019 | Kumar | B60L 3/0061 |
| 2020/0353821 | A1* | 11/2020 | Sato | B60L 58/24 |

FOREIGN PATENT DOCUMENTS

| | | |
|---|---|---|
| JP | 2016-45149 A | 4/2016 |
| KR | 10-2013-0040575 A | 4/2013 |
| KR | 10-1598205 B1 | 3/2016 |
| WO | WO 2015/011534 A2 | 1/2015 |

\* cited by examiner

BATTERY MANAGEMENT METHOD AND APPARATUS

CROSS-REFERENCE TO RELATED APPLICATION(S)

This application claims the benefit under 35 USC § 119(a) of Korean Patent Application No. 10-2016-0128222 filed on Oct. 5, 2016, in the Korean Intellectual Property Office, the entire disclosure of which is incorporated herein by reference for all purposes.

BACKGROUND

1. Field

The following description relates to battery management method and apparatus.

2. Description of Related Art

With the recent importance of environmental and energy resource issues, electric vehicles are becoming more important in the transportation field. As a main power source, for example, electric vehicles may use a battery that includes a plurality of rechargeable secondary cells formed to be a single pack. Here, the electric vehicle may not emit exhaust gas and, thus, may produce little noise.

In the field of electric vehicles, the battery may function as an engine and a fuel tank would in a gasoline car, for example.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

In one general aspect, there is provided a battery management method including calculating a safety of a battery unit based on physical quantity data of the battery unit, monitoring for a threshold adjusting event to occur, performing a comparing with respect to the calculated safety and a threshold based on the monitoring indicating that the threshold adjusting event has occurred, the comparing being based on reference information corresponding to the threshold adjusting event, and selectively performing a feedback process to output a feedback dependent on a result of the comparison.

The comparing may include adjusting, in response to the monitoring indicating that the threshold adjusting event has occurred, the calculated safety based on a determined correspondence between the threshold adjusting event and the reference information, and comparing the adjusted safety to the threshold.

The comparing may include determining, in response to the monitoring indicating that the threshold adjusting event has occurred, the threshold as corresponding to the threshold adjusting event by referencing the reference information, and comparing the calculated safety to the determined threshold.

The reference information may include a reference parameter having a plurality of pieces of level information, each of the plurality of pieces of level information corresponding to numerical data, and the determining of the threshold may include acquiring numerical data corresponding to changed level information of a determined reference parameter, of the reference information and associated with the threshold adjusting event, based on the reference information, defining an adjustment value corresponding to the determined reference parameter based on the acquired numerical data, and determining a value obtained by adding the adjustment value to a reference threshold to be the threshold.

The threshold adjusting event may indicate a change in level information of the determined reference parameter.

The reference parameter included in the reference information may include at least one of a user preference parameter corresponding to a user preference for a number of times that the feedback is output, a use pattern parameter corresponding to a use pattern of a device including the battery unit, an environment parameter, a traffic safety parameter, or an accident history parameter corresponding to information on an accident history of the device.

The use pattern may include at least one of charging-and-discharging history information of the battery unit, harshness information indicating whether a user uses the device harshly, or class information indicating whether the user is a heavy user, the environment parameter may correspond to weather information, and the traffic safety parameter may correspond to at least one of accident blackspot information or safety-vulnerable area information.

The performing of the feedback process may include generating a control signal to output at least one of a visual feedback, an auditory feedback, or a tactile feedback in response to the result of the comparison indicating battery abnormality.

The calculating of the safety of the battery unit may include using a predefined model input the physical quantity data, and determining numerical data output by the predefined model to be the safety.

In one general aspect, there is provided a battery management method including determining a safety of a battery unit based on physical quantity data of the battery unit, monitoring for a threshold adjusting event to occur, and in response to the monitoring indicating that the threshold adjusting event has occurred, defining a weight based on the safety and reference information, adjusting the safety based on the defined weight, comparing the adjusted safety to a threshold, and selectively performing a feedback process for outputting a feedback on the adjusted safety to a user dependent on a result of the comparison.

The reference information may include a reference parameter having a plurality of pieces of level information, each of the plurality of pieces of level information corresponding to numerical data, and the adjusting of the safety may include acquiring numerical data corresponding to current level information of a determined reference parameter, of the reference information and associated with the threshold adjusting event, based on the reference information, and defining a weight, as the defined weight, corresponding to the determined reference parameter based on the acquired numerical data and the safety.

The adjusting of the safety may include acquiring, in response to level information of another reference parameter being changed, another piece of numerical data corresponding to the changed level information of the other reference parameter, defining a weight corresponding to the other reference parameter based on the other piece of numerical data and the safety, and adjusting the safety based on the defined weight corresponding to the determined reference parameter and the defined weight corresponding to the other reference parameter.

The reference parameter may include at least one of a user preference parameter corresponding to a user preference for the number of times that the feedback is output, a use pattern parameter corresponding to a use pattern of a device including the battery unit, an environment parameter, a traffic safety parameter, or an accident history parameter corresponding to information on an accident history of the device.

The use pattern may include at least one of charging-and-discharging history information of the battery unit, harshness information indicating whether a user uses the device harshly, or class information indicating whether the user is a heavy user, the environment parameter may correspond to weather information, and the traffic safety parameter may correspond to at least one of accident blackspot information or safety-vulnerable area information.

In one general aspect, there is provided a non-transitory computer readable medium storing instructions, that when executed by a processor, cause the processor to perform one or more or all of the processes described herein.

In one general aspect, there is provided a battery management apparatus, the apparatus including a communicator configured to receive physical quantity data of a battery unit, and a controller configured to perform a comparing with respect to a safety, calculated based on the received physical quantity data, and a threshold in response to a determination that a threshold adjusting event has occurred, the comparing being based on reference information corresponding to the threshold adjusting event, and perform a feedback process selectively outputting a feedback dependent on a result of the comparison.

To perform the comparing, the controller may be configured to adjust, in response to the determination that the threshold adjusting event has occurred, the safety based on a determined correspondence between the threshold adjusting event and the reference information, and to compare the adjusted safety to the threshold.

To perform the comparing, the controller may be configured to determine, in response to the determination that the threshold adjusting event has occurred, the threshold as corresponding to the threshold adjusting event by referencing the reference information, and to compare the safety to the determined threshold.

The reference information may include a reference parameter having a plurality of pieces of level information, each of the plurality of pieces of level information corresponding to numerical data, and, to determine the threshold, the controller may be configured to acquire numerical data corresponding to changed level information of a determined reference parameter, of the reference information and associated with the threshold adjusting event, based on the reference information, define an adjustment value corresponding to the determined reference parameter based on the acquired numerical data, and determine a value obtained by adding the adjustment value to a reference threshold to be the threshold.

The threshold adjusting event may indicate a change in level information of the determined reference parameter.

The reference parameter included in the reference information may include at least one of a user preference parameter corresponding to a user preference for a number of times that the feedback is output, a use pattern parameter corresponding to a use pattern of a device including the battery unit, an environment parameter, a traffic safety parameter, or an accident history parameter corresponding to information on an accident history of the device.

The use pattern may include at least one of charging-and-discharging history information of the battery unit, harshness information indicating whether a user uses the device harshly, or class information indicating whether the user is a heavy user, the environment parameter may correspond to weather information, and the traffic safety parameter may correspond to at least one of accident blackspot information or safety-vulnerable area information.

Other features and aspects will be apparent from the following detailed description, the drawings, and the claims.

Figure 1:
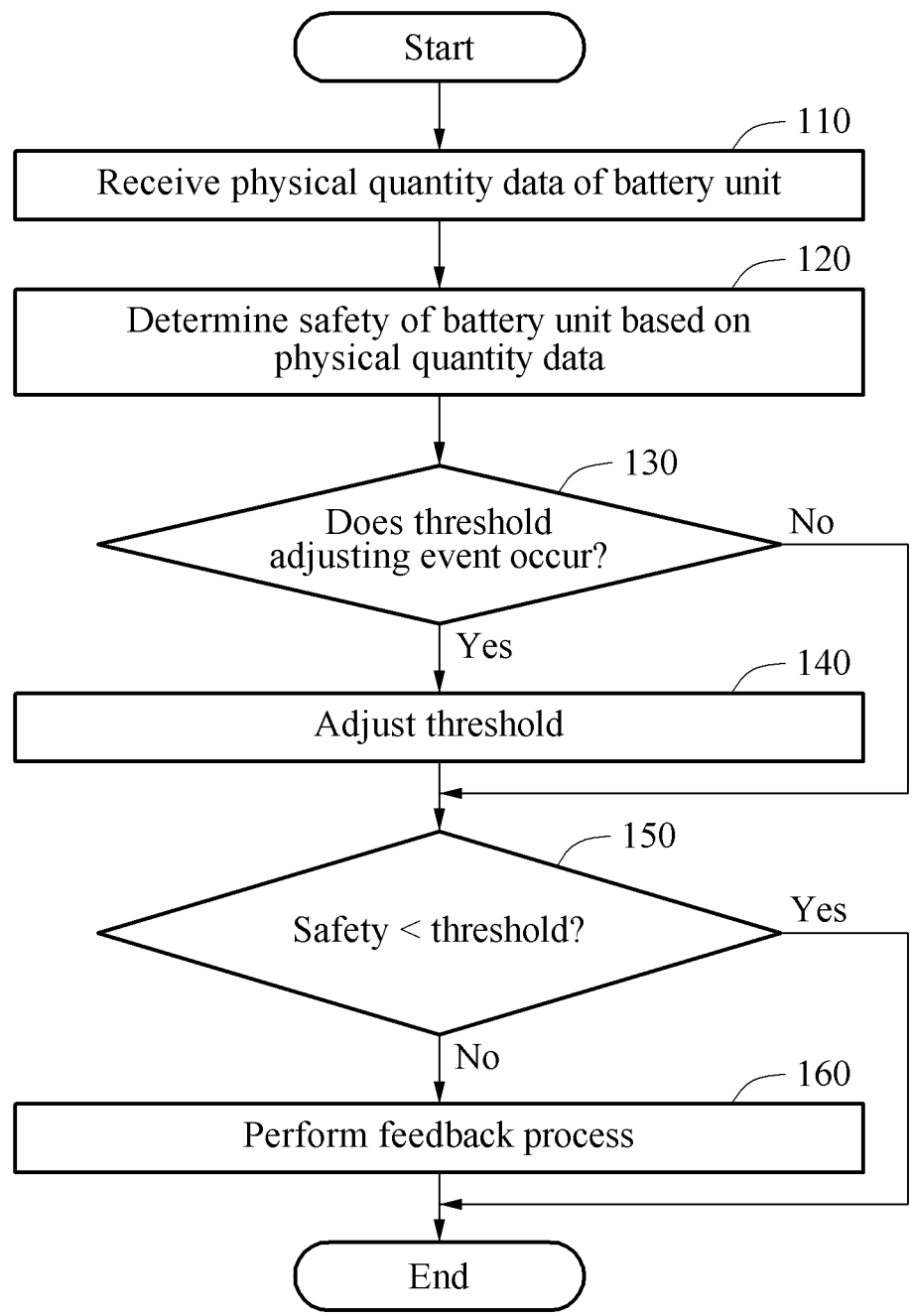
FIG. 1 illustrates an example of a battery management method.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only, and is not to be used to limit the disclosure. As used herein, the terms "a," "an," and "the" are intended to include the plural forms as well, unless the context clearly indicates otherwise. As used herein, the terms "include, "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

When describing the examples with reference to the accompanying drawings, like reference numerals refer to like constituent elements and a repeated description related thereto will be omitted.

FIG. 1 illustrates an example of a battery management method.

The battery management method of FIG. 1 may be performed by a battery management apparatus, including any or any combination of the battery management apparatuses discussed herein, such as FIGS. 2-3 and 7-10. In addition, though operations of FIG. 1 will be discussed below from the perspective of being performed by an example battery management apparatus and merely for ease of explanation, embodiments are not limited thereto.

Accordingly, referring to FIG. 1, in operation 110, the battery management apparatus receives physical quantity data of a battery unit. The battery unit is, for example, a battery cell, a battery module, and a battery pack.

The battery management apparatus receives the physical quantity data of the battery unit from a sensing system. A sensing system including a single sensor or a plurality of sensors collects the physical quantity data of the battery unit at a preset interval, for example, one second. The sensing system transmits the physical quantity data of the battery unit to the battery management apparatus. The physical quantity data includes, for example, voltage data, current data, and/or temperature data. In addition, in an example, the battery management apparatus includes the sensing system. Still further, in an example, such as discussed further with FIGS. 9 and 10, the battery management apparatus may also include the example battery unit, as well as one or more user interfaces.

The battery management apparatus stores the physical quantity data in a buffer, for example. In an example, when the buffer is full of physical quantity data, the battery management apparatus determines a safety of the battery unit.

In operation 120, the battery management apparatus determines the safety of the battery unit based on the physical quantity data of the battery unit. For example, the battery management apparatus inputs the physical quantity data to a predefined model, and the predefined model outputs numerical data or numerical value. The predefined model may be a trained neural network, machine learned model, trained Hidden Markov Model (HMM), trained support vector machine (SVM), Long Short Term Memory (LSTM), or other trained computational model, as only examples. The battery management apparatus determines the output numerical data to represent the safety of the battery unit.

In operation 130, the battery management apparatus verifies whether a threshold adjusting event occurs. The threshold adjusting event indicates change in level information of a reference parameter included in reference information, such as represented below in Table 1, for example. Here, the reference information of Table 1 is merely an example, and the reference information is not limited to the example.

TABLE 1

| Level information | User preference parameter | Use pattern parameter | Environment parameter | Traffic safety parameter | Accident history parameter |
| --- | --- | --- | --- | --- | --- |
| 1 | 0 | 0 | 0 | 0 | 0 |
| 2 | −0.05 | −0.05 | −0.02 | −0.05 | −0.1 |
| 3 | −0.1 | −0.1 | −0.05 | −0.1 | −0.2 |

In Table 1, the reference parameter includes the user preference parameter, the use pattern parameter, the environment parameter, the traffic safety parameter, and the accident history parameter. Also, a plurality of items of level information in the reference parameter corresponds to the numerical data. The reference information will also be described with reference to FIG. 2.

The battery management apparatus collects information corresponding to the reference parameter, and determines level information of the reference parameter based on the collected information. For example, an electric vehicle including a battery and the battery management apparatus traveling an area corresponding to level information 1 of the traffic safety parameter enters an accident blackspot area corresponding to level information 3. In this example, the battery management apparatus verifies that the electric vehicle enters the accident blackspot area corresponding to the level information 3 based on location information, for example, global positioning system (GPS) information of the electric vehicle and received accident blackspot area information, for example. Through this, level information of the traffic safety parameter is determined to be the level information 3. In response to the change in the level information, the threshold adjusting event occurs.

When the threshold adjusting event occurs, the battery management apparatus adjusts a threshold in operation 140. The battery management apparatus adjusts the threshold using numerical data corresponding to the changed level information of the reference parameter. For example, when the threshold adjusting event occurs, the battery management apparatus references the reference information of Table 1 to adjust the threshold. The battery management apparatus acquires the numerical data corresponding to the changed level information of the reference parameter associated with the threshold adjusting event from the reference information. In the foregoing example, when the electric vehicle enters the determined accident blackspot area corresponding to the level information 3, the battery management apparatus acquires "−0.1" which is numerical data corresponding to the level information 3 of the traffic safety parameter from the reference information. The battery management apparatus defines an adjustment value corresponding to the reference parameter associated with the threshold adjusting event based on the numerical data. In the foregoing example, the battery management apparatus defines the adjustment value to be "−0.1".

When the adjustment value is defined, the battery management apparatus may calculate the threshold using the below Equation 1, for example.

Threshold=Reference threshold+Adjustment value corresponding to reference parameter   Equation 1:

The reference threshold is a preset value, for example, "0.9". The value of 0.9 is merely an example and thus, the reference value is not limited to the example.

In the foregoing example, when no other threshold adjusting event is determined to also have occurred, the threshold is 0.8 (=0.9-0.1) according to Equation 1.

In operation 150, the battery management apparatus compares the safety to the threshold. When the threshold adjusting event is determined to occur, the battery management apparatus adjusts the threshold and compares the safety to the adjusted threshold. When the threshold adjusting event is determined to have not occurred, the threshold is not adjusted and thus, the battery management apparatus compares the safety merely to the threshold set in advance, such as the reference threshold.

In operation 160, when the safety is determined to be less than the threshold, the battery management apparatus performs a feedback process. The battery management apparatus generates a control signal such that at least one of a visual feedback, an auditory feedback, or a tactile feedback is output to a user. The battery management apparatus transmits the control signal to an electronic control unit (ECU) included in the electric vehicle. The ECU displays the visual feedback on a display based on the control signal. As noted above, and as applicable to the remainder of the disclosure, depending on example, the battery management apparatus may also include the electronic vehicle, the ECU (or other vehicle control unit) with the sensing system and/or the feedback user interface, the ECU, or may merely be a separate processor or processing element distinguished from the ECU, the sensing system, and the feedback user interface and merely, for example, be included in such an electronic vehicle or other battery operated device.

In the foregoing example, the electric vehicle may determine that the electric vehicle has now also entered an area corresponding to level information 2, from the accident blackspot area corresponding to the level information 3. The battery management apparatus acquires "−0.05" which is a numerical value corresponding to the level information 2 of the traffic safety parameter from the reference information. The battery management apparatus redefines the adjustment value from "−0.1" to "−0.05". As expressed by Equation 1 "Threshold=Reference value+Adjustment value", the threshold is 0.85(=0.9-0.05) unless another threshold adjusting event also occurs. In an example, the battery management apparatus may add a difference value between the numerical data corresponding to the level information 2 of the traffic safety parameter and the numerical data corresponding to the level information 3 of the traffic safety parameter to the existing adjusted threshold. In this example, the difference value is 0.05(=−0.05−(−0.1)) and the threshold is also 0.85(=0.8+0.05).

Figure 2:
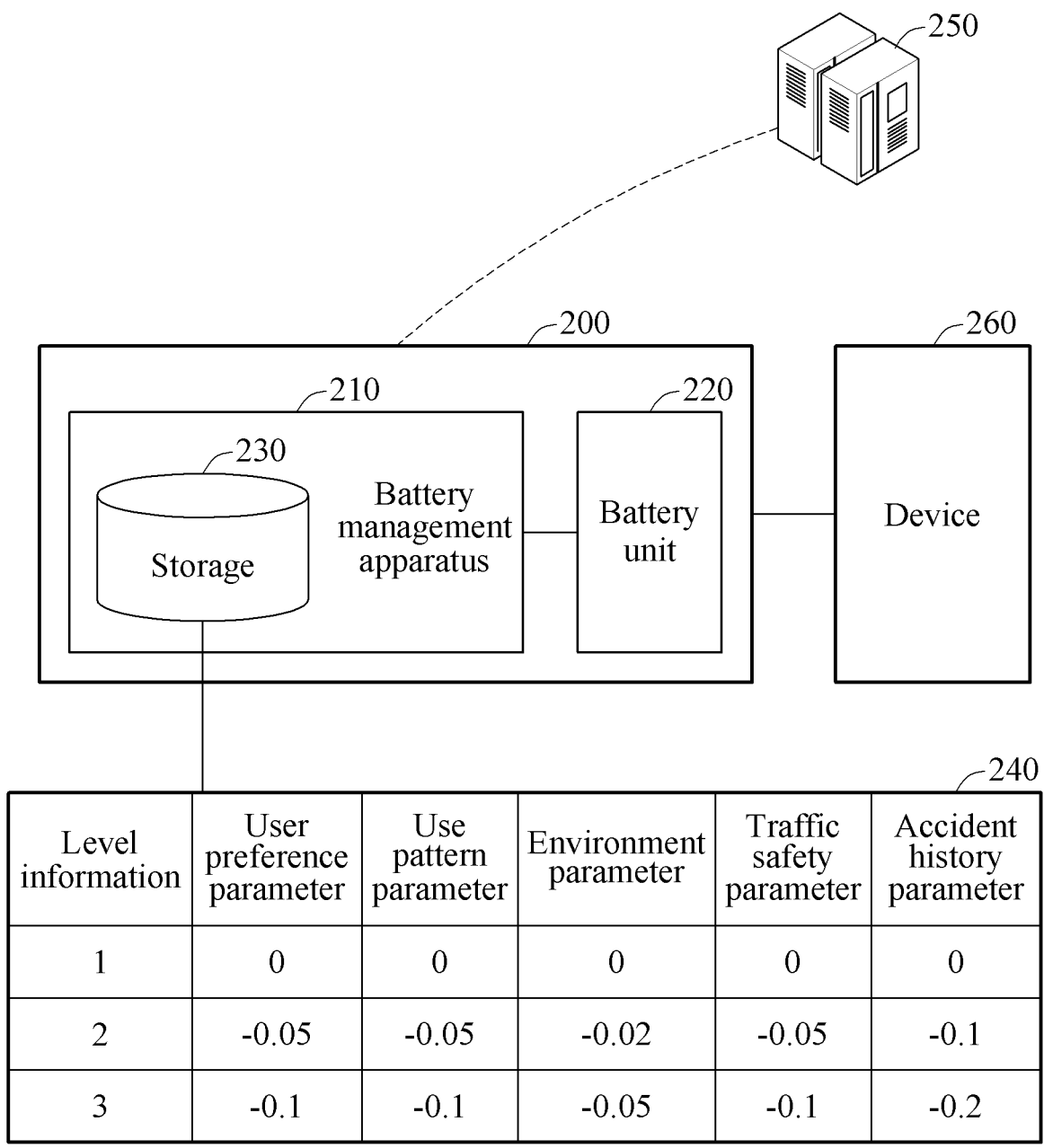
FIG. 2 illustrates an example of reference information.

FIG. 2 illustrates an example of reference information.

Referring to FIG. 2, an apparatus 200 includes a battery management apparatus 210 and a battery unit 220.

The apparatus 200 is, for example, a vehicle using the battery unit 220 as a power source such as an electric vehicle or a hybrid vehicle. However, a type of the apparatus 200 is not limited thereto.

The apparatus 200 is also representative of including a communication interface to communicate with a server 250.

The apparatus 200 receives reference information 240 from the server 250. The reference information 240 is stored in a storage 230 included in the battery management apparatus 210. In contrast to an example of FIG. 2, the reference information 240 is also stored external to the battery management apparatus 210.

The reference information 240 includes a reference parameter including a plurality of items of level information. The plurality of items of level information of the reference parameter each corresponds to numerical data.

A reference parameter may include a user preference parameter. The user preference parameter corresponds to a user preference for the number of outputs of a feedback associated with a determined safety. The battery management apparatus 210 stores the user preference associated with the user preference parameter in the storage 230. The battery management apparatus 210 acquires numerical data corresponding to the user preference by referencing the user preference parameter. For example, the battery management apparatus 210 causes a selection between "intermediate" from "small", "intermediate", and "large" to be visually, haptically, or audibly provided to a user using a corresponding user interface of the device 260, and to determine which level information of the user preference parameter to implement based on the determined user selection. For example, the user may select a feedback output count to be "intermediate" from "small", "intermediate", and "large" using the device 260. In this example, the battery management apparatus 210 references the user preference parameter and acquires "−0.05" which is numerical data of the level information 2 corresponding to "intermediate" selected by the user. When the user selects "small", the battery management apparatus 210 acquires numerical data "0". When the user selects "large", the battery management apparatus 210 acquires numerical data "−0.1".

When the user changes the user preference, which the battery management apparatus 210 may permit at select or continuous times, the battery management apparatus 210 determines level information corresponding to the changed user preference. The battery management apparatus 210 adjusts a threshold based on the determined level information.

The reference parameter may include a use pattern parameter.

The use pattern parameter corresponds to a use pattern of the apparatus 200 including the battery unit 220. For example, the use pattern includes at least one of charging-and-discharging history information of the battery unit 220, harshness information indicating whether the user harshly uses the apparatus 200, or class information indicating whether the user is a heavy user.

The use pattern parameter is classified into level information 1 through 3. For example, level information 1 corresponds to at least one of a case in which a charging-and-discharging cycle count of the battery unit 220 is determined to be less than an average count, a case in which the apparatus 200 is determined to be used mildly in comparison to a predetermined reference, or a case in which the user is determined to be a light user. Level information 2 corresponds to at least one of a case in which a charging-and-discharging cycle count is determined to be average, a case in which the apparatus 200 is determined to be used in a way that matches a predetermined reference, or a case in which the user is determined to be a normal user. Level information 3 corresponds to a case in which a charging-and-discharging cycle count is determined to be greater than or equal to an average count, a case in which the apparatus 200 is determined to be used harshly in comparison to a predetermined reference, or a case in which the user is determined to be a heavy user.

The battery management apparatus 210 stores one or more or all of the charging-and-discharging history information, the harshness information, and the class information of the battery unit 220 in the storage 230. For example, the battery management apparatus 210 monitors one or more or all of the charging-and-discharging history information, the harshness information, and the class information. The battery management apparatus 210 verifies whether the level information of the use pattern parameter is changed through the monitoring. When the level information of the use pattern parameter is changed, the battery management apparatus 210 acquires numerical data corresponding to the changed level information. For example, when the user is determined to be changed from the normal user to the heavy user, the battery management apparatus 210 references the reference information 240 and acquires "−0.1" which is numerical data of the level information 3 and adjusts the threshold accordingly.

The reference parameter may include an environment parameter.

The environment parameter corresponds to determined or received weather information including temperature and humidity. The environment parameter is classified into level information 1 through 3. For example, the level information 1 corresponds to when a determined temperature is determined to be higher than or equal to 20 degrees Celsius (° C.) and lower than 40° C. The level information 2 corresponds to when a determined temperature is determined to be higher than or equal to 10° C. and lower than 20° C., or when a determined temperature is determined to be higher than or equal to 40° C. and lower than 50° C. The level information 3 corresponds to when a determined temperature is determined to be higher than or equal to 0° C. and lower than 10° C., or when a determined temperature is determined to be higher than or equal to 50° C. and lower than 60° C.

The battery management apparatus 210 collects the weather information, such as from server 250, and monitors the collected weather information. In an example, the battery management apparatus includes a thermometer to collect the weather information, or collects the weather information from a control system of the example vehicle that includes the thermometer. The battery management apparatus 210 verifies whether the level information of the environment parameter is changed through the monitoring. When the level information of the environment parameter is determined to be changed, the battery management apparatus 210 acquires numerical data corresponding to the changed level information. For example, the battery management apparatus 210 monitors temperature. In this example, when the temperature decreases from 20° C. to 18° C., the battery management apparatus 210 acquires "−0.02" which is numerical data of the level information 2, and adjusts the threshold accordingly.

The reference parameter may include a traffic safety parameter.

The traffic safety parameter corresponds to at least one of captured, measured, or received accident blackspot area information or safety-vulnerable area information. The traffic safety parameter is classified into level information 1 through 3. The level information 1 corresponds to a determination that the vehicle is in a determined little or no traffic accident occurring area and/or a determined high safety area. The level information 2 corresponds to a determination that the vehicle is in an area of which the number of traffic accidents is determined to be average and/or determined to be an average safety area. The level information 3 corresponds to a determination that the vehicle is in an area of which the number of traffic accidents is determined to be large and/or in a safety-vulnerable area, for example, a determined mountainous area and a determined area in which a falling-rock accident has previously been determined to occur.

The battery management apparatus 210 may collect information associated with the traffic safety parameter, for example, GPS information or navigation information of the apparatus 200, and verifies whether the level information of the traffic safety parameter is changed based on the collected information. For example, the battery management apparatus 210 may verify that the apparatus 200 has entered an area corresponding to the level information 2 from an area corresponding to the level information 1 based on the GPS information. In this example, the battery management apparatus 210 references the reference information 240, acquires "−0.05" which is numerical data of the level information 2, and adjusts the threshold accordingly.

The reference parameter may include an accident history parameter.

The accident history parameter corresponds to accident history information of the apparatus 200. The battery management apparatus 210 may receive the accident history information from the server 250, while the battery management apparatus 210 may also or alternatively store the accident history information in the storage 230. The battery management apparatus 210 acquires numerical data corresponding to the accident history information of the apparatus 200 by referencing the accident history parameter. For example, when the number of accidents of the apparatus 200 is determined to be zero or less than an average, the battery management apparatus acquires "0" which is numerical data of level information 1 by referencing the accident history parameter. When the number of accidents of the apparatus 200 is determined to be about a preset average, the battery management apparatus 210 acquires "−0.1" which is numerical data of level information 2. When the number of accidents of the apparatus 200 is determined greater than the preset average or the apparatus 200 is determined to be critically damaged by an accident, the battery management apparatus 210 acquires "−0.2" which is numerical data of level information 3.

When the apparatus 200 having no accident history is critically damaged by an accident, and the apparatus 200 receives accident history information from the server 250, the accident history information may be updated and, due to the critical accident, the battery management apparatus 200 determines level information of the accident history parameter to be the level information 3. The battery management apparatus 200 acquires the numerical data of the level information 3 of "−0.2" and adjusts the threshold accordingly.

The foregoing explanation about the reference information and the reference parameter are merely examples and thus, embodiments are not limited thereto. For example, the reference parameter may include one or more or all of the example user preference parameter, use pattern parameter, environment parameter, traffic safety parameter, and accident history parameter. The reference parameter may also include other parameters, and thus is not limited to the example user preference parameter, use pattern parameter, environment parameter, traffic safety parameter, and accident history parameter.

Figure 3:
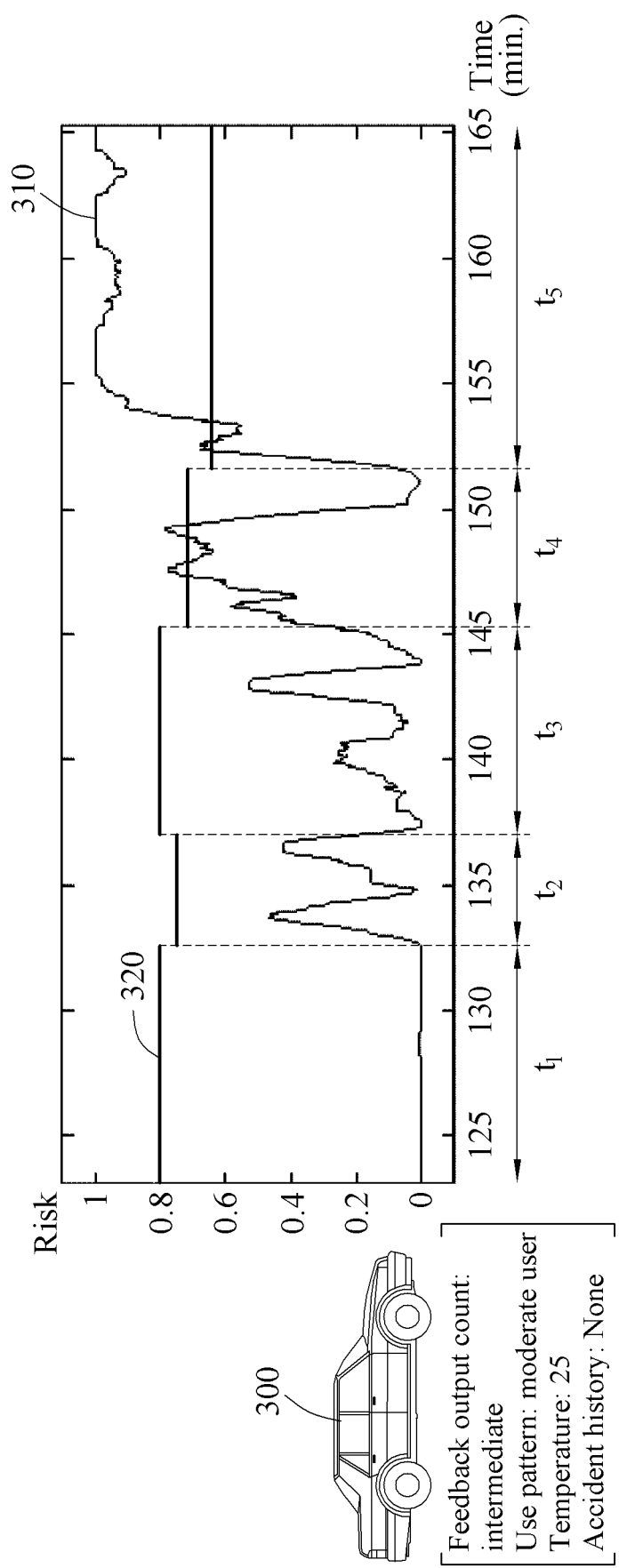
FIG. 3 illustrates an example of an operation of a battery management apparatus.

FIG. 3 illustrates an example of an operation of a battery management apparatus.

Referring to FIG. 3, in an example, a determined user preference for a feedback output count is "intermediate", a determined use pattern is of a moderate use between a light use and a heavy use, a determined temperature of an apparatus 300 is 25°, and the apparatus 200 is determined to have no history of accidents. In this example, a threshold adjusting event occurs due to the existing or newly selected user preference, the corresponding category of the use pattern, and the temperature of the apparatus 300. In response to the threshold adjusting event occurring, the battery management apparatus references the corresponding reference information. By referencing the reference information of FIG. 2, the battery management apparatus respectively acquires "−0.05", "−0.05", "0", and "0". Here, the battery management apparatus defines an adjustment value corresponding to the user preference parameter of "−0.05", defines an adjustment corresponding to the use pattern parameter of "−0.05", defines an adjustment value corresponding to the environment parameter of 0, and defines an adjustment value corresponding to the accident history parameter of "0". According to Equation 1, a threshold is obtained using "Reference threshold+−0.05+−0.05+0+0". In this example, if the reference threshold is "0.9", and thus the adjusted threshold is "0.8".

The following descriptions are provided with respect to FIG. 3 based on an example in which the apparatus 300 is traveling.

FIG. 3 illustrates a risk 310 and the adjusted threshold 320 over time. The battery management apparatus collects physical quantity data of a battery unit and determines the risk 310. The risk 310 is a criterion corresponding to a safety as described above. Also, the risk 310 is obtained, for example, by subtracting the safety from "1". For example, the risk or safety may be determined according to known approaches, as discussed above.

The example total adjusted threshold corresponding to the time interval $t_1$ is represented in Table 2 as below.

TABLE 2

| Reference threshold | Adjustment value for user preference parameter | Adjustment value for use pattern parameter | Adjustment value for environment parameter | Adjustment value for traffic safety parameter | Adjustment value for accident history parameter | Total |
|---|---|---|---|---|---|---|
| 0.9 | −0.05 | −0.05 | 0 | 0 | 0 | 0.8 |

Since no threshold adjusting event is determined to occur during the time interval $t_1$, the threshold remains, or is maintained to be, the same as a threshold set before the apparatus 300 travels.

The apparatus 300 then travels an interval of which the number of accidents is determined to correspond to a preset average amount during the time interval $t_2$. Accordingly, here, this newly traveled interval where the apparatus 300 enters is an interval corresponding to level information 2 of the traffic safety parameter, and thus, level information of the traffic safety parameter has changed from time interval $t_1$. Thus, in this example, a threshold adjusting event has occurred. Accordingly, the battery management apparatus acquires "−0.05" which is the numerical data of the level information 2 of the traffic safety parameter from the reference information of FIG. 2, and defines an adjustment value corresponding to the traffic safety parameter as "−0.05".

The example total adjusted threshold corresponding to the time interval $t_2$ is represented in Table 3 as below.

TABLE 3

| Reference threshold | Adjustment value for user preference parameter | Adjustment value for use pattern parameter | Adjustment value for environment parameter | Adjustment value for traffic safety parameter | Adjustment value for accident history parameter | Total |
|---|---|---|---|---|---|---|
| 0.9 | −0.05 | −0.05 | 0 | −0.05 | 0 | 0.75 |

In comparison to Table 2, the adjustment value corresponding to the traffic safety parameter has changed to "−0.05", and thus the threshold is newly adjusted to "0.75".

Departing from the interval corresponding to the level information 2 of the traffic safety parameter, the apparatus 300 travels a normal interval during a time interval $t_3$. Since the normal interval corresponds to level information 1 of the traffic safety parameter, the level information of the traffic safety parameter has changed. In this example, the battery management apparatus acquires "0" which is numerical data of the level information of the traffic safety parameter from the reference information of FIG. 2, and defines the adjustment value corresponding to the traffic safety parameter as "0".

The example total adjusted threshold corresponding to the time interval $t_3$ is represented in Table 4 as below.

TABLE 4

| Reference threshold | Adjustment value for user preference parameter | Adjustment value for use pattern parameter | Adjustment value for environment parameter | Adjustment value for traffic safety parameter | Adjustment value for accident history parameter | Total |
|---|---|---|---|---|---|---|
| 0.9 | −0.05 | −0.05 | 0 | 0 | 0 | 0.8 |

In comparison to Table 2, the adjustment value corresponding to the traffic safety parameter has changed to "0" and thus the threshold is newly adjusted from "0.75" to "0.8".

Departing from the normal interval, the apparatus 300 travels an interval in which a falling-rock accident has occur during a time interval $t_4$. As the interval is an interval corresponding to level information 3 of the traffic safety parameter, the level information of the traffic safety parameter has changed. In this example, the battery management apparatus acquires "−0.1" which is numerical data corresponding to the level information 3 of the traffic safety parameter from the reference information of FIG. 2, and defines the adjustment value corresponding to the traffic safety parameter as "−0.1".

The example total adjusted threshold corresponding to the time interval $t_4$ is represented in Table 5 as below.

TABLE 5

| Reference threshold | Adjustment value for user preference parameter | Adjustment value for use pattern parameter | Adjustment value for environment parameter | Adjustment value for traffic safety parameter | Adjustment value for accident history parameter | Total |
|---|---|---|---|---|---|---|
| 0.9 | −0.05 | −0.05 | 0 | −0.1 | 0 | 0.7 |

As shown in Table 5, the adjustment value corresponding to the traffic safety parameter has changed to "−0.1" and thus the threshold is newly adjusted from "0.8" to "0.7".

In the time interval $t_4$, a determined or calculated safety of a battery is determined to exceed the adjusted threshold. In this example, upon or in response to the safety being determined to exceed the adjusted threshold, at least one of a visual feedback, an auditory feedback, or a tactile feedback indicating that an abnormality is detected in the battery is output. When the threshold is not adjusted, the battery management apparatus may not sense an abnormal state of the battery.

A temperature may decrease while the apparatus 300 is traveling the interval corresponding to the level information 3 of the traffic safety parameter. For example, when level information of the environment parameter changes from level information 1 to level information 2 due to the decreasing temperature, the battery management apparatus acquires "−0.02" which is numerical data corresponding to the level information 2 of the environment parameter, and defines an adjustment value corresponding to the environment parameter as "−0.02".

The example total adjusted threshold corresponding to a time interval $t_5$ is represented in Table 6 as below.

TABLE 6

| Reference threshold | Adjustment value for user preference parameter | Adjustment value for use pattern parameter | Adjustment value for environment parameter | Adjustment value for traffic safety parameter | Adjustment value for accident history parameter | Total |
|---|---|---|---|---|---|---|
| 0.9 | −0.05 | −0.05 | −0.02 | −0.1 | 0 | 0.68 |

In Table 6, due to the temperature change in time interval $t_5$, the threshold is adjusted from "0.7" to "0.68".

The battery management apparatus adjusts the threshold by collecting information on a road condition and a weather condition. Through this, the battery management apparatus senses the abnormal state of the battery with increased accuracy.

Figure 4:
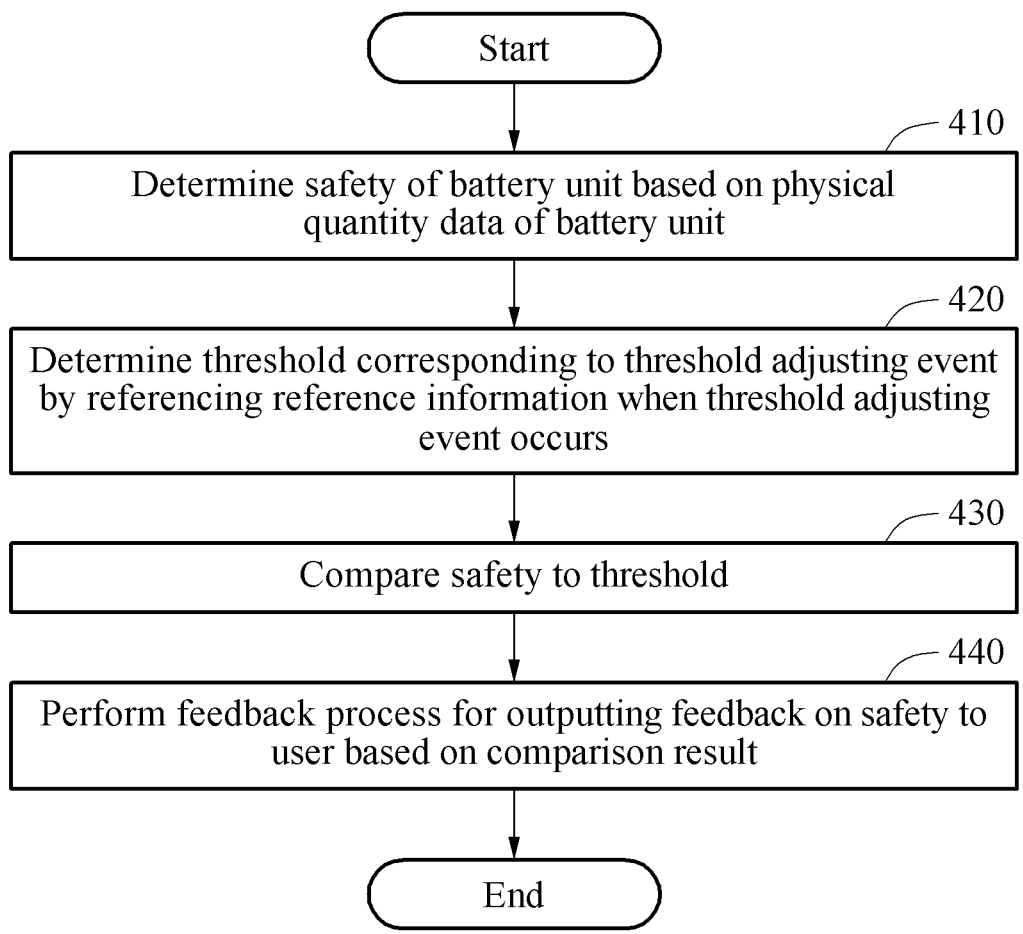
FIG. 4 illustrates an example of a battery management method.

FIG. 4 illustrates an example of a battery management method.

The battery management method of FIG. 4 may be performed by a battery management apparatus, including any or any combination of the battery management apparatuses discussed herein, such as FIGS. 2-3 and 7-10. In addition, though operations of FIG. 4 will be discussed below from the perspective of being performed by an example battery management apparatus and merely for ease of explanation, embodiments are not limited thereto. In addition, descriptions above with respect to FIGS. 1-3 and 5-6 regarding example battery management apparatuses and corresponding operations are also applicable, and available in combination with the operations of FIG. 4, and thus, descriptions of the same are not repeated below.

Referring to FIG. 4, in operation 410, the battery management apparatus determines a safety of a battery unit based on physical quantity data of the battery unit.

When a threshold adjusting event occurs, the battery management apparatus determines a threshold corresponding to the threshold adjusting event by referencing reference information in operation 420.

In operation 430, the battery management apparatus compares the safety to the threshold.

In operation 440, the battery management apparatus performs a feedback process for outputting a feedback on the safety to a user based on a comparison result.

Figure 5:
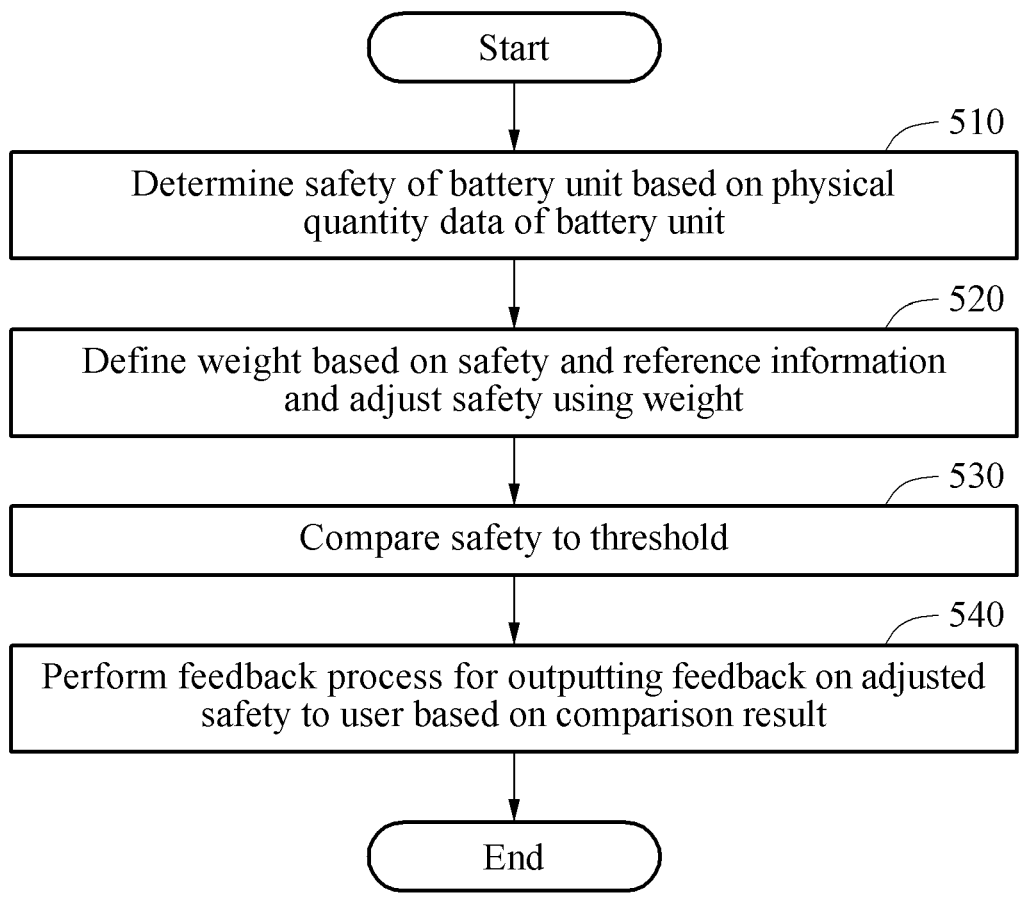
FIGS. 5 and 6 illustrate an example of a battery management method.
Figure 6:
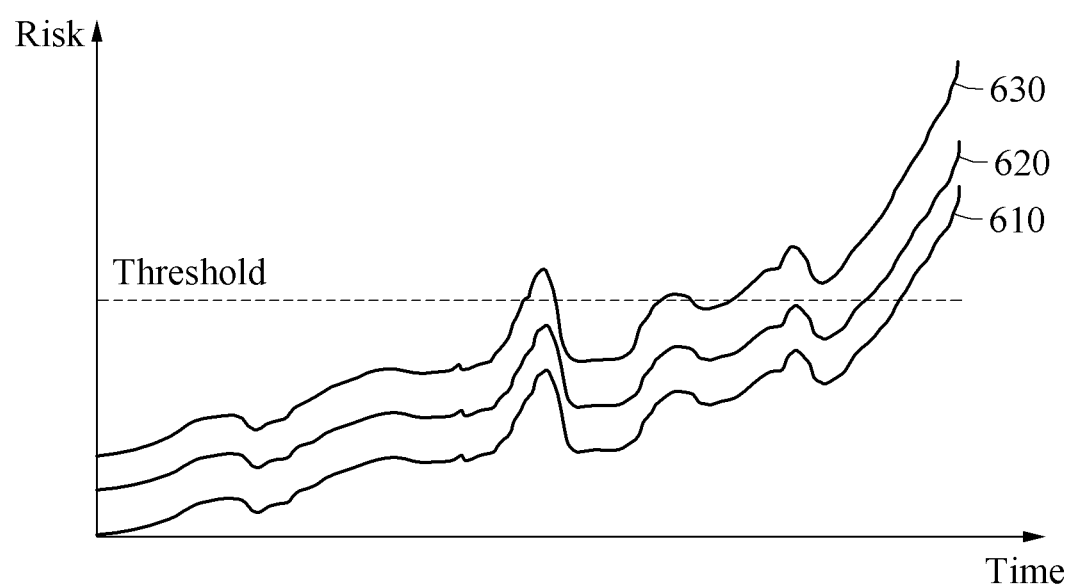

FIGS. 5 and 6 illustrate an example of a battery management method.

The battery management method of FIG. 5 may be performed by a battery management apparatus, including any or any combination of the battery management apparatuses discussed herein, such as FIGS. 2-3 and 7-10. In addition, though operations of FIG. 5 will be discussed below from the perspective of being performed by an example battery management apparatus and merely for ease of explanation, embodiments are not limited thereto. In addition, descriptions above with respect to FIGS. 1-4 regarding example battery management apparatuses and corresponding operations are also applicable, and available in combination with the operations of FIG. 5, and thus, descriptions of the same are not repeated below.

Referring to FIG. 5, in operation 510, the battery management apparatus determines a safety of a battery unit based on physical quantity data of the battery unit. For example, and as noted above, the battery management apparatus inputs the physical quantity data to a predefined model, and the predefined model outputs numerical data. The battery management apparatus determines the numerical data to be the safety. For example, the determined safety may be "0.6", e.g., as a normalized numerical or probabilistic value between 0 and 1.

In operation 520, the battery management apparatus defines a weight based on the safety and reference information and adjusts the safety using the weight. The battery management apparatus acquires numerical data corresponding to current level information of a reference parameter by referencing reference information as described with reference to FIGS. 2 and 3, for example. For example, when a user is classified by the battery management apparatus or the example server as a heavy user, and when a use pattern parameter is level information 3, the battery management apparatus acquires the example numerical data "−0.1" from the reference information. In this example, the battery management apparatus applies an absolute value to the numerical data. The battery management apparatus defines a value obtained by multiplying the safety by the numerical data to be the weight, e.g., by multiplying "0.1" by the example reference threshold "0.6" to obtain the weight "0.06" corresponding to the use pattern parameter.

Thus, in this example, the battery management apparatus defines the weight corresponding to the reference parameter as shown in the below Table 7. Here, the weight represented in Table 7 is merely an example.

TABLE 7

| Reference threshold | Adjustment value for user preference parameter | Adjustment value for use pattern parameter | Adjustment value for environment parameter | Adjustment value for traffic safety parameter | Adjustment value for accident history parameter | Total |
| --- | --- | --- | --- | --- | --- | --- |
| 0.6 | 0 | 0.06 | 0 | 0 | 0 | 0.66 |

The battery management apparatus may adjust the safety using the below Equation 2, for example.

Adjusted safety=Safety+Weight corresponding to reference parameter     Equation 2:

In the foregoing example, the adjusted safety is 0.66 (=0.6+0.06).

When level information of another reference parameter is also changed, the battery management apparatus defines an adjustment value corresponding to the other reference parameter based on numerical data corresponding to the changed level information. For example, when level information of the traffic safety parameter is also changed from level information 1 to level information 3, having corresponding numerical data of "−0.1", the weight is calculated to be "0.06". According to Equation 2, the adjusted safety is 0.72(=0.6+0.06+0.06).

In operation 530, the battery management apparatus compares the adjusted safety to the threshold.

In operation 540, the battery management apparatus performs a feedback process for outputting a feedback on the adjusted safety to a user based on a result of the comparison.

In the foregoing example, when the level information of the traffic safety parameter is changed from the level information 3 to the level information 1, the numerical data is "0" and the weight corresponding to the traffic safety parameter is calculated to be "0". According to Equation 2, the adjusted safety is 0.66(=0.6+0.06).

FIG. 6 illustrates risks 610, 620, and 630 of a battery unit, and a threshold.

In FIG. 6, the risk 610 represents a case in which a use pattern corresponds to level information 1, for example, a case in which a charging-and-discharging cycle count is relatively small, the risk 620 represents a case in which a use pattern corresponds to level information 2, for example, a case in which a charging-and-discharging cycle count is average, and the risk 630 represents a case in which a use pattern corresponds to level information 3, for example, a case in which a charging-and-discharging cycle count is relatively large.

Accordingly, FIG. 6 demonstrates that the adjusted risk, e.g., 1—adjusted safety, may increase according to an increase in the number of times that a user uses an apparatus.

Figure 7:
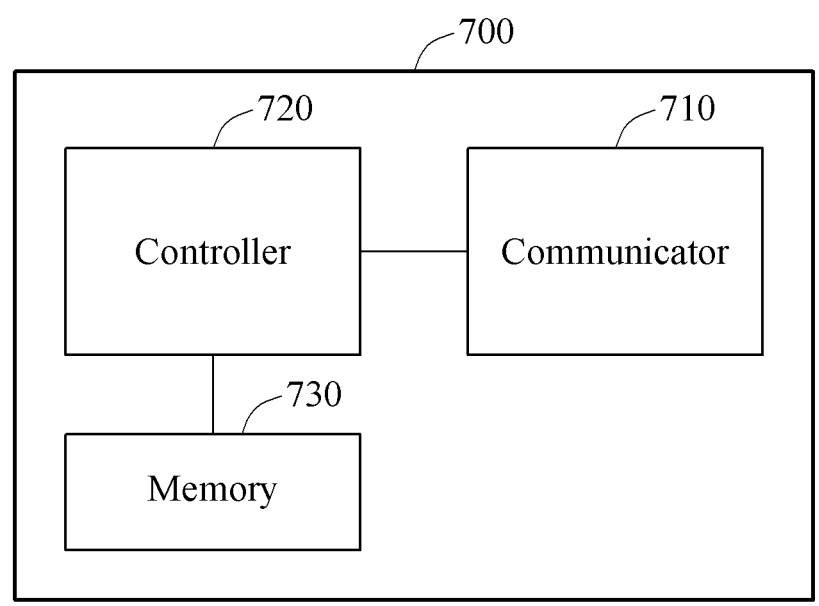
FIGS. 7 and 8 illustrate an example of a battery management apparatus.
Figure 8:
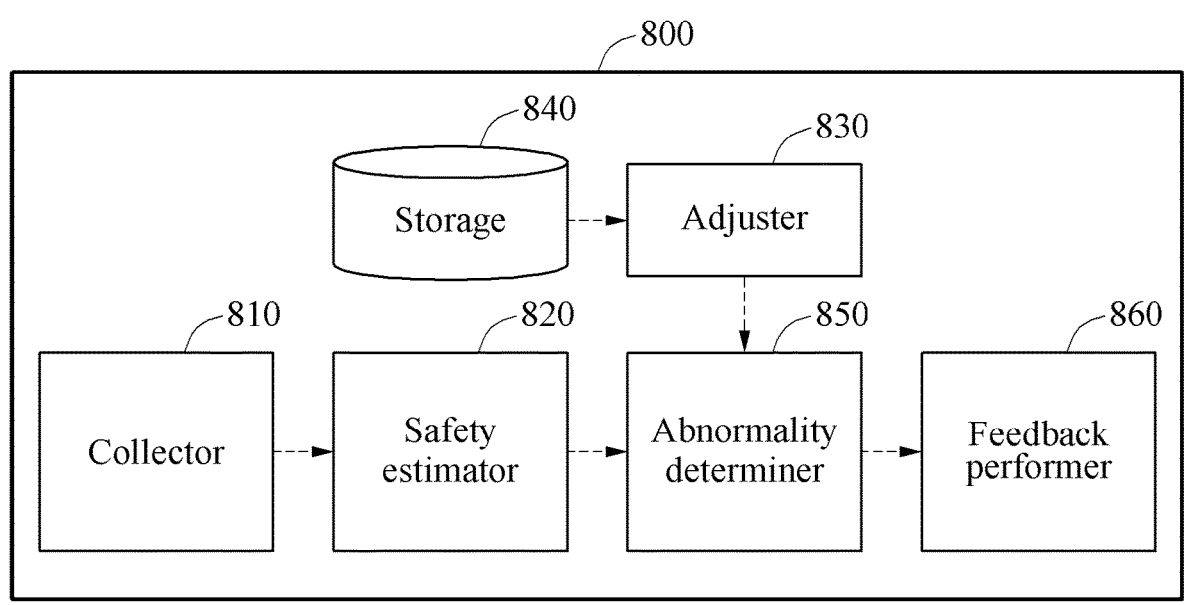

FIGS. 7 and 8 illustrate an example of a battery management apparatus.

Referring to FIG. 7, a battery management apparatus 700 includes a communicator 710, a controller 720, and a memory 730, for example.

The communicator 710 receives physical quantity data of a battery unit.

The controller 720 is a computing hardware configured to determine a safety of the battery unit based on the physical quantity data.

The controller 720 is further configured such that, when a threshold adjusting event is determined to occur, the controller 720 determines a threshold corresponding to the threshold adjusting event by referencing reference information. Through this, a threshold set before the threshold adjusting event occurs is adjusted. Since the foregoing explanation with respect to FIGS. 1-4 about adjustments of the threshold are also applicable here, repeated description will be omitted. Alternatively, or also available, the controller 720 is configured to adjust the safety in lieu of the threshold, such as discussed above with respect to FIG. 5. In this example, the controller 720 defines a weight based on the safety and the reference information and adjusts the safety. Here, as descriptions regarding FIGS. 5-6 are also applicable here, repeated descriptions with respect to the adjustment of the threshold and/or the adjustment of the safety will be omitted.

The controller 720 compares the safety to the threshold, and performs a feedback process to output a feedback on the safety to a user based on a results of the comparison. The controller 720 is also representative of one or more processors.

The memory 730 is a non-transitory computer readable medium and stores instructions, which executed by a processor of the controller 720, to cause the processor to implement one or more or all of the operations described herein.

In this example, the communicator 710, the controller 720, and/or the memory 730 may be implemented by at least one processor or processing device, for example, a micro control unit (MCU), such as of a vehicle.

Referring to FIG. 8, a battery management apparatus 800 includes a collector 810, a safety estimator 820, an adjuster 830, a storage 840, an abnormality determiner 850, and a feedback performer 860, for example.

One of the collector 810, the safety estimator 820, the adjuster 830, the storage 840, the abnormality verifier 850, and the feedback performer 860 or any combination thereof may be implemented by at least one processor or processing device, such as by the processor or processing device discussed above with respect to FIG. 7 or respectively implemented by execution of instructions stored in the non-transitory computer readable storage 840 as discussed above with respect to FIG. 7.

Accordingly, the collector 810 collects physical quantity data of a battery unit.

The safety estimator 820 estimates a safety of the battery unit based on the physical quantity data of the battery unit.

When a threshold adjusting event occurs, the adjuster 830 adjusts a threshold by referencing reference information stored in the storage 840. Also, the adjuster 830 defines a weight based on the safety and the reference information and adjusts the safety based on the weight.

The abnormality verifier 850 compares the safety and the threshold and determines whether the battery unit is in an abnormal state or in a normal state.

The feedback performer 860 performs a feedback process when the safety is less than the threshold and the battery unit is determined to be in the abnormal state.

Since the descriptions of FIGS. 1 through 7 are also applicable here, repeated description of FIG. 8 will be omitted.

Figure 9:
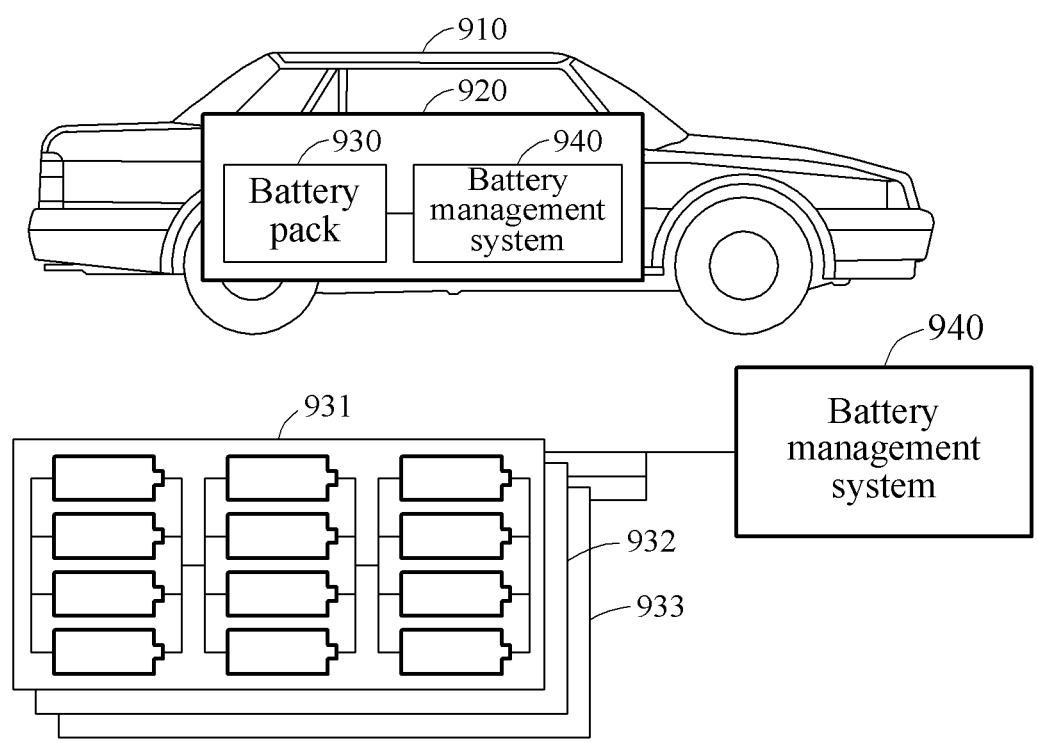
FIGS. 9 and 10 illustrate an example of a battery management apparatus.
Figure 10:
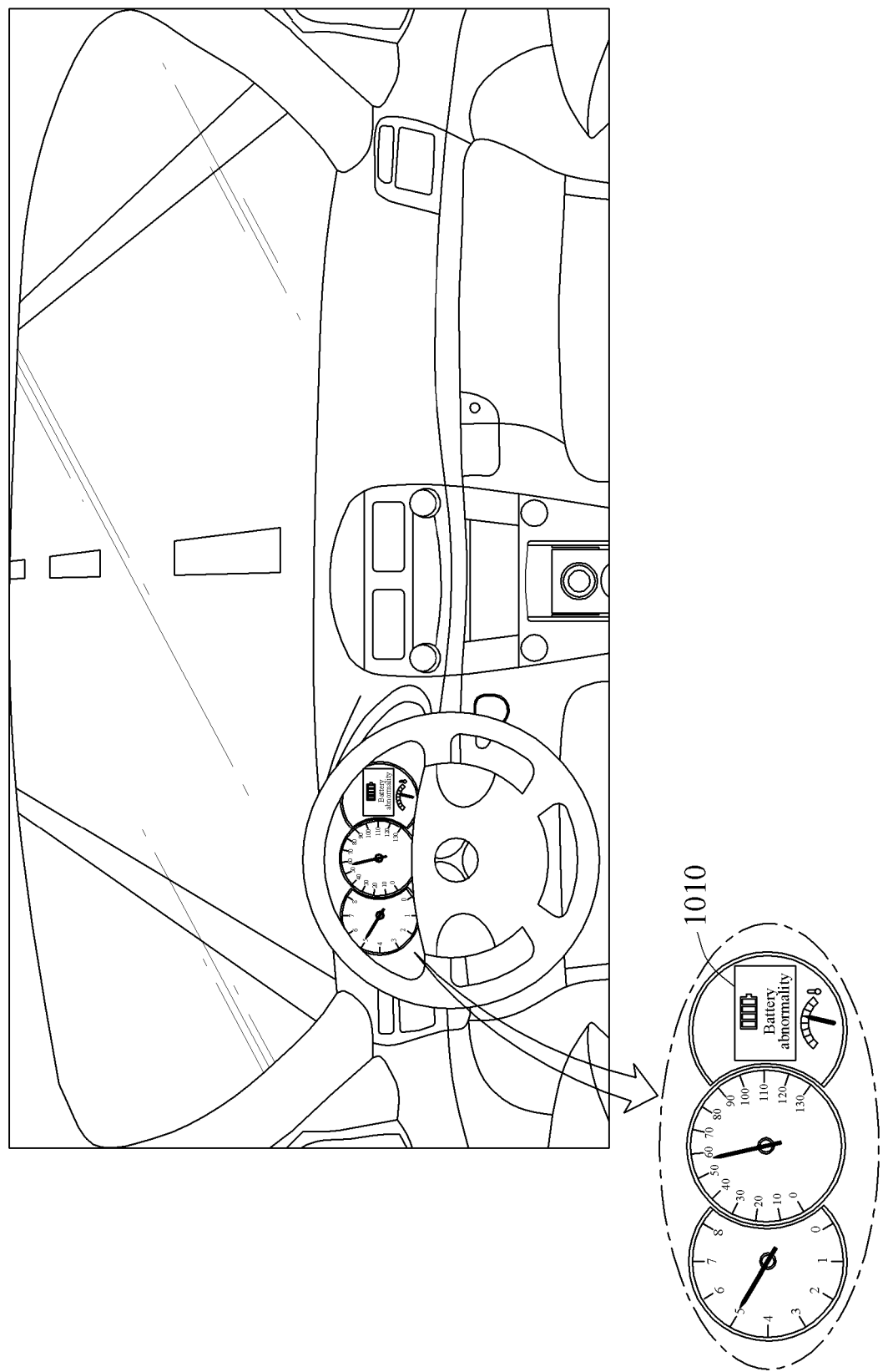

FIGS. 9 and 10 illustrate an example of a battery management apparatus.

Referring to FIG. 9, an apparatus 910 may include a battery management apparatus or be representative of the battery management apparatus itself. The apparatus 910 may be a vehicle using a battery as a power source. The vehicle is, as only an example, an electric vehicle or a hybrid vehicle. The vehicle is merely described as an example of the apparatus 910 and thus, a type of the apparatus 910 is not limited thereto, and thus, the apparatus 910 may also be air, land, or water borne drone, or other land, air, or water borne vehicle.

The apparatus 910 includes a battery system 920. The battery system 920 includes a battery pack 930 and a battery management system 940.

The battery pack 930 includes a plurality of battery modules 931, 932, and 933. Each of the plurality of battery modules 931, 932, and 933 includes at least one battery cell. The battery pack 930 is further representative of a sensing system to respectively monitor the battery modules 931, 932, and 933.

Depending on embodiment, the battery management system 940 or the apparatus 910 corresponds to the battery management apparatus described with reference to any or any combination of the above discussions regarding FIGS. 1 through 8. The battery management system 940 collects physical quantity data of a battery cell included in each of the plurality of battery modules 931, 932, and 933 and/or module data of each of the plurality of battery modules 931, 932, and 933, such as by using the sensing system of the battery pack 930. The module data includes voltage data, current data, and/or temperature data of each of the plurality of battery modules 931, 932, and 933. The battery management system 940 inputs the collected physical quantity data and/or module data to a predefined model and determines a safety of at least one of each of a plurality of battery cells, each of the plurality of battery modules 931, 932, and 933, and/or the battery pack 930 as a whole. When a threshold adjusting event occurs, the battery management system 940 adjusts a threshold by referencing reference information and compares the safety to the adjusted threshold. Through this, the battery management system 940 verifies whether at least one of each of the plurality of battery cells, each of the plurality of battery modules 931, 932, and 933, and/or the battery pack 930 is in an abnormal state. When the safety is less than the adjusted threshold, the battery management system 940 performs a feedback process through a user interface included in the apparatus 910, such as illustrated in FIG. 10, to alert the driver of the abnormal state.

The battery management system compares a safety to an adjusted threshold or compares an adjusted safety to a threshold to verify whether a battery unit, for example, a battery cell, a battery module, or a battery pack is in an abnormal state during a driving of a device. Through this, an accident risk may decrease and reliability on detecting an abnormality in a battery may increase.

Also, the safety (or a risk) or the threshold is adjusted based on a use pattern of the apparatus 910, a user preference, environment information, for example, temperature, humidity, and altitude of an area in which the apparatus 910 is used, information on an area in which the apparatus 910 travels, for example, a road condition and the number of accidents occurring in the area, or accident information, for example, the number of accidents, an accident severity of the apparatus 910, and comparison between the threshold and the safety may be performed. Through this, an abnormal state of the battery may be detected with increased accuracy.

Since the descriptions of FIGS. 1 through 8 are also applicable here, repeated description of FIG. 9 will be omitted.

Referring to FIG. 10, illustrated is an example user interface of a battery management apparatus, such as of the apparatus 910 or the battery management system 940 of FIG. 9, with FIG. 10 demonstrating an example display of a feedback on a dashboard through a feedback process of the battery management apparatus/system. When a safety is less than a threshold, or when a risk is greater than the threshold, the battery management apparatus/system performs the feedback process. For example, the apparatus 910 or the battery management system 940 of FIG. 9 may generate a control signal, and transits the control signal to the ECU of the apparatus 910, which displays a visual feedback on a dashboard or a display of a device physically differing from the dashboard. For example, the visual feedback may be provided using the illustrated battery abnormality indicator 1010. Also, the ECU may be controlled to provide an auditory feedback in a form of an alarming sound indicating "Battery is in abnormal state".

The battery management apparatus, battery management system, sensors, sensing system, controller, apparatus 200, storage 230, battery management apparatus 210, battery unit 220, server 250, device 260, apparatus 300, battery management apparatus 700, controller 720, memory 730, communicator 710, battery management apparatus 800, collector 810, safety estimator 820, adjuster 830, storage 840, abnormality determiner 850, feedback performer 860, apparatus 910, battery system 920, battery pack 930, battery module 931, battery module 932, battery module 933, battery management system 940 and battery abnormality indicator 1010 of FIGS. 1-10 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-10 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management method, the method comprising:
    calculating a safety of a battery unit based on physical quantity data of the battery unit, wherein the safety corresponds to a risk of an abnormal state of the battery unit;
    monitoring for a threshold adjusting event to occur;
    adjusting a threshold in response to the threshold adjusting event occurring;
    performing a comparing with respect to the calculated safety and the adjusted threshold; and
    selectively performing a feedback process to output a feedback dependent on a result of the comparison,
    wherein the calculating of the safety of the battery unit includes using a predefined model input the physical quantity data, and determining numerical data output by the predefined model to be the safety, and
    wherein the adjusting includes determining, in response to the monitoring indicating that the threshold adjusting event has occurred, the adjusted threshold as corresponding to the threshold adjusting event by referencing reference information.

2. The battery management method of claim 1, wherein the comparing includes adjusting, in response to the monitoring indicating that the threshold adjusting event has occurred, the calculated safety based on a determined correspondence between the threshold adjusting event and reference information, and comparing the adjusted safety to the adjusted threshold.

3. The battery management method of claim 1, wherein the comparing includes comparing the calculated safety to the determined adjusted threshold.

4. The battery management method of claim 1, wherein the reference information includes a reference parameter having a plurality of pieces of level information, each of the plurality of pieces of level information corresponding to numerical data, and
    wherein the determining of the adjusted threshold includes:
    acquiring numerical data corresponding to changed level information of a determined reference parameter, of the reference information and associated with the threshold adjusting event, based on the reference information;
    defining an adjustment value corresponding to the determined reference parameter based on the acquired numerical data; and
    determining a value obtained by adding the adjustment value to a reference threshold to be the adjusted threshold.

5. The battery management method of claim 4, wherein the threshold adjusting event indicates a change in level information of the determined reference parameter.

6. The battery management method of claim 4, wherein the reference parameter included in the reference information includes at least one of a user preference parameter corresponding to a user preference for a number of times that the feedback is output, a use pattern parameter corresponding to a use pattern of a device including the battery unit, an environment parameter, a traffic safety parameter, or an accident history parameter corresponding to information on an accident history of the device.

7. The battery management method of claim 6, wherein the use pattern includes at least one of charging-and-discharging history information of the battery unit, harshness information indicating whether a user uses the device harshly, or class information indicating whether the user is a heavy user,
    the environment parameter corresponds to weather information, and
    the traffic safety parameter corresponds to at least one of accident blackspot information or safety-vulnerable area information.

8. The battery management method of claim 1,
    wherein the performing of the feedback process includes generating a control signal to output at least one of a visual feedback, an auditory feedback, or a tactile feedback in response to the result of the comparison indicating battery abnormality.

9. A battery management method, the method comprising:
determining a safety of a battery unit based on physical quantity data of the battery unit, wherein the safety corresponds to a risk of an abnormal state of the battery unit;
monitoring for level information of a reference parameter included in reference information to change; and
in response to the monitoring indicating that the level information has changed, defining a weight based on the safety and changed level information of the reference parameter, adjusting the safety based on the defined weight, comparing the adjusted safety to a threshold, and selectively performing a feedback process for outputting a feedback on the adjusted safety to a user dependent on a result of the comparison,
wherein the determining of the safety of the battery unit includes using a predefined model input the physical quantity data, and determining numerical data output by the predefined model to be the safety.

10. The battery management method of claim 9, wherein the reference parameter having a plurality of pieces of level information, each of the plurality of pieces of level information corresponding to numerical data, and
wherein the adjusting of the safety includes:
acquiring numerical data corresponding to current level information of the reference parameter from the reference information; and
defining a weight, as the defined weight, corresponding to the reference parameter based on the acquired numerical data and the safety.

11. The battery management method of claim 10, wherein the adjusting of the safety includes:
acquiring, in response to level information of another reference parameter being changed, another piece of numerical data corresponding to the changed level information of the other reference parameter;
defining a weight corresponding to the other reference parameter based on the other piece of numerical data and the safety; and
adjusting the safety based on the defined weight corresponding to the determined reference parameter and the defined weight corresponding to the other reference parameter.

12. The battery management method of claim 10, wherein the reference parameter includes at least one of a user preference parameter corresponding to a user preference for the number of times that the feedback is output, a use pattern parameter corresponding to a use pattern of a device including the battery unit, an environment parameter, a traffic safety parameter, or an accident history parameter corresponding to information on an accident history of the device.

13. The battery management method of claim 12, wherein the use pattern includes at least one of charging-and-discharging history information of the battery unit, harshness information indicating whether a user uses the device harshly, or class information indicating whether the user is a heavy user,
the environment parameter corresponds to weather information, and
the traffic safety parameter corresponds to at least one of accident blackspot information or safety-vulnerable area information.

14. A non-transitory computer readable medium storing instructions, that when executed by a processor, cause the processor to perform the method of claim 1.

15. A battery management apparatus, the apparatus comprising:
a communicator configured to receive physical quantity data of a battery unit; and
a controller configured to
adjust a threshold in response to a threshold adjusting event occurring,
perform a comparing with respect to a safety of the battery unit, calculated based on the received physical quantity data, and the adjusted threshold in response to the threshold adjusting event having occurred, and
perform a feedback process selectively outputting a feedback dependent on a result of the comparison,
wherein the safety corresponds to a risk of an abnormal state of the battery unit,
wherein the safety of the battery unit is calculated using a predefined model input the physical quantity data by determining numerical data output by the predefined model to be the safety, and
wherein, for the adjusting, the controller is configured to determine, in response to a determination that the threshold adjusting event has occurred, the adjusted threshold as corresponding to the threshold adjusting event by referencing reference information.

16. The battery management apparatus of claim 15, wherein, to perform the comparing, the controller is configured to adjust, in response to the determination that the threshold adjusting event has occurred, the safety based on a determined correspondence between the threshold adjusting event and reference information, and to compare the adjusted safety to the threshold.

17. The battery management apparatus of claim 15, wherein, to perform the comparing, the controller is configured to compare the safety to the determined adjusted threshold.

18. The battery management apparatus of claim 15, wherein the reference information includes a reference parameter having a plurality of pieces of level information, each of the plurality of pieces of level information corresponding to numerical data, and
wherein, to determine the adjusted threshold, the controller is configured to acquire numerical data corresponding to changed level information of a determined reference parameter, of the reference information and associated with the threshold adjusting event, based on the reference information, define an adjustment value corresponding to the determined reference parameter based on the acquired numerical data, and determine a value obtained by adding the adjustment value to a reference threshold to be the adjusted threshold.

19. The battery management apparatus of claim 18, wherein the threshold adjusting event indicates a change in level information of the determined reference parameter.

20. The battery management apparatus of claim 18, wherein the reference parameter included in the reference information includes at least one of a user preference parameter corresponding to a user preference for a number of times that the feedback is output, a use pattern parameter corresponding to a use pattern of a device including the battery unit, an environment parameter, a traffic safety parameter, or an accident history parameter corresponding to information on an accident history of the device.

21. The battery management apparatus of claim 20, wherein the use pattern includes at least one of charging-and-discharging history information of the battery unit, harshness information indicating whether a user uses the device harshly, or class information indicating whether the user is a heavy user, the environment parameter corresponds to weather information, and the traffic safety parameter corresponds to at least one of accident blackspot information or safety-vulnerable area information.

\* \* \* \* \*